United States Patent
Hortig et al.

(10) Patent No.: US 8,418,544 B2
(45) Date of Patent: Apr. 16, 2013

(54) BENDING TRANSDUCER FOR GENERATING ELECTRICAL ENERGY FROM MECHANICAL DEFORMATIONS

(75) Inventors: Michael Hortig, Eningen (DE);
Thorsten Pannek, Stuttgart (DE);
Gustav Klett, Moessingen (DE);
Marian Keck, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 374 days.

(21) Appl. No.: 12/735,485

(22) PCT Filed: Nov. 25, 2008

(86) PCT No.: PCT/EP2008/066157
§ 371 (c)(1),
(2), (4) Date: Oct. 13, 2010

(87) PCT Pub. No.: WO2009/097925
PCT Pub. Date: Aug. 13, 2009

(65) Prior Publication Data
US 2011/0023592 A1   Feb. 3, 2011

(30) Foreign Application Priority Data
Feb. 6, 2008   (DE) .................. 10 2008 007 774

(51) Int. Cl.
*B60C 23/02* (2006.01)
(52) U.S. Cl.
USPC ................ 73/146.5; 73/715; 73/721; 73/727
(58) Field of Classification Search .......... None
See application file for complete search history.

(56) References Cited

U.S. PATENT DOCUMENTS

| | | | |
|---|---|---|---|
| 4,406,966 A * | 9/1983 | Paros | 310/321 |
| 5,063,542 A * | 11/1991 | Petermann et al. | 367/166 |
| 5,536,963 A * | 7/1996 | Polla | 257/417 |
| 5,663,505 A * | 9/1997 | Nakamura | 73/702 |
| 5,836,203 A * | 11/1998 | Martin et al. | 73/579 |
| 6,442,812 B1* | 9/2002 | Kovacich et al. | 29/25.35 |
| 7,296,473 B2* | 11/2007 | Ishii et al. | 73/729.1 |
| 7,343,787 B2* | 3/2008 | Oflaz | 73/146 |
| 7,360,429 B1* | 4/2008 | Filippelli | 73/715 |
| 8,011,252 B2* | 9/2011 | Watanabe et al. | 73/717 |
| 8,015,881 B2* | 9/2011 | Motoyama | 73/717 |
| 8,089,736 B2* | 1/2012 | Yang | 361/23 |
| 8,297,124 B2* | 10/2012 | Watanabe et al. | 73/715 |

FOREIGN PATENT DOCUMENTS

| | | |
|---|---|---|
| DE | 196 20 826 | 11/1997 |
| DE | 100 23 556 | 11/2001 |
| DE | 10 2005 062 872 | 3/2007 |
| DE | 10 2006 012 321 | 9/2007 |
| JP | 2004-289067 | 10/2004 |
| WO | WO 01/89003 | 11/2001 |
| WO | WO 2007/000781 | 1/2007 |

* cited by examiner

*Primary Examiner* — Lisa Caputo
*Assistant Examiner* — Jermaine Jenkins
(74) *Attorney, Agent, or Firm* — Kenyon & Kenyon LLP

(57) ABSTRACT

A bending transducer for generating electrical energy from deformations includes at least: one deformable support device, on which a first connecting electrode and a second connecting electrode are formed, one piezoelectric element attached to the support device having a least one first electrode and one second electrode, the first connecting electrode being contacted with the first electrode of the piezoelectric element, and the second connecting electrode being contacted with the second electrode of the piezoelectric element. The first connecting electrode and/or the second connecting electrode are applied as a structured conductive layer to the support device in at least some areas.

12 Claims, 3 Drawing Sheets

BENDING TRANSDUCER FOR GENERATING ELECTRICAL ENERGY FROM MECHANICAL DEFORMATIONS

BACKGROUND OF THE INVENTION

1. Field of the Invention

The present invention relates to a bending transducer for generating electrical energy from mechanical deformations.

2. Description of Related Art

Piezoelectric transducer mechanisms are used in the area of sensor and actuator systems in particular. For converting the mechanical stresses occurring in deformed structures, a piezoelectric element is generally coupled directly to a support element, i.e., a support structure, whereby the support structure may also be a second piezoelectric element (known as a piezoelectric bimorph). The piezoelectric element here has two electrodes for supplying and removing electrical charges to and from an electronic interface. The electrodes here are generally designed to be on the opposite sides of the piezoelectric element, which is usually flat.

For example, published German patent application document DE 10 2005 062 872 A1 describes a device for detecting the rolling motion of a vehicle wheel in which a piezoelectric element is contacted on a chip carrier via the electrodes formed on its opposite sides, its upper electrode being contacted via a wire bond, and the chip carrier, including the piezoelectric element and the wire bond, is cast into a mold compound. In such sensors for measuring accelerations, e.g., vibrations, reliable contacting is thus possible with little complexity.

Moreover, piezoelectric materials are increasingly used for generating electrical energy from energies of the surroundings, in particular vibrations and deformations; this is also referred to as energy harvesting. Bending deformations of the piezoelectric element are enabled here which result in clearly higher energy generation than, for example, the mechanical strains of a piezoelectric element cast into a mold compound, as allowed by published German patent application document DE 10 2005 062 872 A1.

In bending transducers in which the support structure and the piezoelectric element are fixedly restrained, electrical contacting may be implemented in a relatively simple manner since the piezoelectric element is fixedly connected to a housing. The use of a sufficiently large-surface and thus expensive piezoelectric element is generally required for such configurations, the areas of the piezoelectric element at the housing connection being exposed to only relatively minor changes in mechanical stress.

If the piezoelectric element is not fixedly restrained, contacting generally takes place via flexible wire connections. However, these wire connections are also exposed to the mechanical stresses that occur and have, with respect to the repeated deformations, only limited reliability.

BRIEF SUMMARY OF THE INVENTION

The bending transducer according to the present invention permits simple and reliable contacting of the piezoelectric element with the support element, in particular even with structure sizes in the area of precision mechanics. The bending transducer is also suitable for applications in sensor systems and actuator systems, in particular also for generating energy, it also being usable as an energy source for separate or even autarkic systems, e.g., sensor modules.

A bending transducer is understood according to the present invention to be a device which absorbs mechanical energy from mechanical deformation, in particular a nonuniform deformation, and generates electrical energy from it through the piezoelectric effect. Bending moments about one or more axes in particular may thus be absorbed, possibly also superpositioning of various individual bending moments.

According to the present invention, it is possible to mechanically attach piezoelectric elements to the structure of the connecting electrodes. An additional wire or spring contacting may therefore be eliminated. Advantages include simpler manufacturing and assembly as well as increased reliability, in particular due to the improved stability.

Both connecting electrodes are preferably designed as structured areas of a shared conductive layer on the receiving side, i.e., in general the top side of the support. The design of the structured conductive layer is possible with the aid of lithography and an etching process, for example.

The support is preferably designed to be flat and elastically deformable. The piezoelectric element is preferably situated on the support in the area of maximum deformation.

According to an advantageous refinement of the present invention, the support is manufactured entirely or partially from a conductive material such as metal, at least one connecting electrode being applied to an insulator, preferably an insulating layer.

This also makes it possible to use metal supports in particular. Metal supports made of steel plate or brass plate, for example, have a high deflectability, which allows a high piezoelectric voltage of the applied piezoelectric element. In addition, they have a good elasticity with low energy absorption and little material fatigue, so the support is able to remain stable over the lifetime of the bending element.

An advantageous embodiment of the present invention provides that the piezoelectric element is subdivided into multiple segments, at least two, having different polarities, preferably opposing polarities. The exact design may be adapted to the mechanical deformations to be expected, so that energy may also be generated from complex bending patterns and bends in different directions.

According to the present invention, it is recognized here that a compact design may be achieved by contacting two or more segments on their top side via a shared conductive layer, so they are mutually contacted in a suitable manner, for example, as a series connection and/or as a parallel connection. Series connections in particular are advantageous here for increasing the output voltage. In addition, individual segments or series connections of individual segments may also be contacted separately first in different terminal contactings of the support and subsequently utilized as a power supply via a shared circuit, e.g., with diodes.

In the embodiment of the piezoelectric element having only one segment of uniform polarity, such a compact layer structure may be achieved, on the one hand, by directly contacting the first electrode formed on the connecting side of the piezoelectric element via a conductive connecting area and, on the other hand, the second electrode is not only formed on the top side of the piezoelectric element opposite the connecting side but also extends at least over a lateral edge area and advantageously also to the connecting side, forming a (relatively small) contacting area there which is contacted with the second connecting electrode of the support device via a second conductive connecting middle area.

Contacting between the connecting electrodes of the support device and the electrodes of the piezoelectric element may thus take place completely via areas of a conductive connecting middle layer, preferably of conductive adhesive or solder. This attachment to a flat connection has a high durability and ensures secure contacting. Such a connection is resistant in particular to vibrations, oscillations and other loads and does not have the disadvantages in this regard associated with traditional wire bond connections or other connections using additional contact elements.

The bending transducer may thus be designed completely as a stack of layers including the support device, the piezoelectric element, the conductive adhesive or solder areas and the electrodes or connecting electrodes, in particular having plane-parallel layers in the undeformed state and thus having a compact and mechanically stable structure.

The piezoelectric element may be designed in one-piece in particular, having multiple segments if necessary. In addition, multiple piezoelectric elements may also be provided on a shared support device, e.g., in series connection to increase the achievable voltage or in parallel connection to increase the amperage. The piezoelectric elements here may absorb bending stresses, for example, in different areas of the support device and for different bending directions. Furthermore, a piezoelectric element having more than two electrodes may be provided, e.g., with four electrodes situated in a cross pattern to be able to generate energy with different bending stresses.

In addition, the present invention relates to a sensor module having a bending transducer according to the present invention as part of the power supply; the sensor module according to the present invention may be energetically autarkic in particular, e.g., having an energy storage for temporary storage and/or for smoothing the electrical energy generated. The sensor module may be in particular a tire sensor module, in particular for measuring a tire pressure, a temperature and/or accelerations, vibrations and/or deformations. Such a tire sensor module according to the present invention may, for example, be integrated directly into the tread of a tire according to the present invention, e.g., in a vertical orientation.

DETAILED DESCRIPTION OF THE INVENTION

Figure 1:
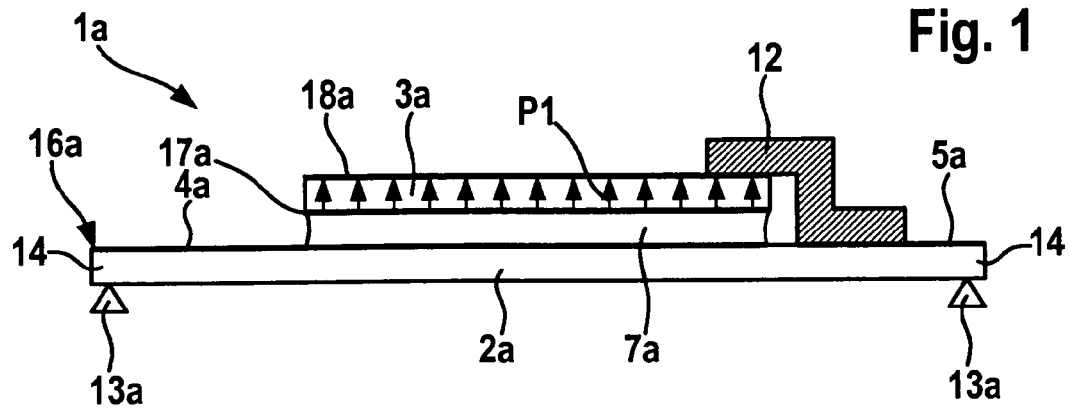
FIG. 1 shows a first embodiment of a bending transducer according to the present invention having a single-segment design of the piezoelectric element.

A bending transducer 1a shown in FIG. 1 includes a deformable support 2a and a piezoelectric element 3a. Support 2a has a flat and plane-parallel shape and is elastically deformable. It is supported or clamped here with its two opposite side areas 14 on supporting elements 13a, thus allowing deformation to occur between these supporting elements, in particular a bending deformation. A first connecting electrode 4a and second connecting electrode 5a are applied to top side 16a of support 2a as part of a structured conductive layer, in particular a metal layer, with the aid of a lithographic and etching process, and extend laterally outward.

Piezoelectric element 3a is also designed to be flat. It is manufactured from a ceramic material in particular and in this specific embodiment has a uniform direction of polarization P1. On its bottom side, functioning as the connecting side, it has a first lower electrode 17a, and on its top side it has a second upper electrode 18a, both electrodes 17a and 18a being applied as metal layers, for example. Piezoelectric element 3a is situated on support 2a in the area of its maximum deformation, i.e., in particular in its lateral central area, in such a way that its direction of polarization P1 is oriented perpendicular to support 2a.

Piezoelectric element 3a is mechanically fixedly connected and contacted to first connecting electrode 4a via its lower electrode 17a with the aid of an integrally joined conductive layer 7a, in particular a conductive adhesive layer 7a or solder layer 7a.

Upper electrode 18a is contacted to second connecting electrode 5a via a contact plate 12, in particular a doubly bent contact plate.

Thus a mechanically stable stack system is formed from support 2a, adhesive 7a, and piezoelectric element 3a. In a bending stress of support 2a between supporting elements 13a, piezoelectric element 3a is deformed accordingly, the piezoelectric voltage generated thereby being tappable via connecting electrodes 4a and 5a and thus via the top side of support 2a.

Figure 2:
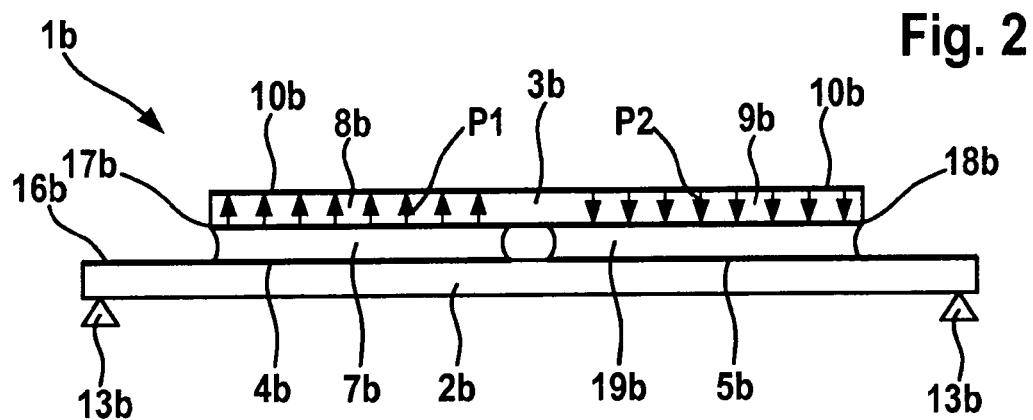
FIG. 2 shows a second embodiment of a bending transducer according to the present invention having a multisegment design of the piezoelectric element.

In the example embodiment of FIG. 2, a first connecting electrode 4b and a second connecting electrode 5b are in turn formed as areas of a structured conductive layer, in particular a metal layer on top side 16b of an elastically deformable nonconductive flat and plane-parallel support 2b. Support 2b thus corresponds essentially to support 2a from FIG. 1 and differs therefrom by the precise structuring of connecting electrodes 4b and 5b.

Piezoelectric element 2b is subdivided into a first segment 8b and a second segment 9b having oppositely oriented polarizations P1 and P2. A continuous conductive layer 10b, in particular a metal layer 10b, is applied to the top side of piezoelectric element 2b and thus covers the top sides of both segments 8b, 9b and contacts them with one another. A structured conductive layer, in particular a metal layer, is applied to the bottom side of piezoelectric element 2b and is structured in such a way that it forms a first electrode 17b and a second electrode 18b. A conductive adhesive layer or solder layer is applied here to top side 16b of support 2b in such a way that it forms a first conductive integrally joined adhesive layer 7b between first electrode 17b and first connecting electrode 4a and forms a second conductive integrally joined adhesive area 19b between second electrode 5b and second connecting electrode 4a.

Both segments 8b and 9b of piezoelectric element 3b are thus contacted via shared metal layer 10b and are connected in series between connecting electrodes 4b and 5b.

Figure 3:
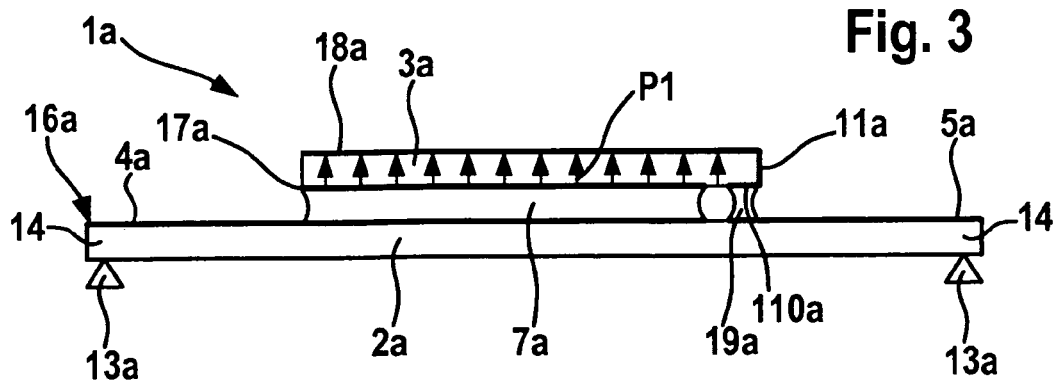
FIG. 3 shows a third embodiment of a bending transducer according to the present invention having a single-segment design of the piezoelectric element.

In the example embodiment of FIG. 3, bending transducer 1a has a single-segment piezoelectric element 3a according to FIG. 1, second electrode 18a not only being formed on the top side of piezoelectric element 3a but also extending with an edge area 11a over the lateral surface and running to the bottom side or connecting side of the piezoelectric element, where the second electrode forms a contacting area 110a spaced a distance away laterally from first electrode 17a and contacting second connecting electrode 5a. Thus, a compact layer structure is also achieved in FIG. 3, in which both connecting electrodes 4a and 5a extend to beneath piezoelectric element 3a, and the contacting is accomplished via two conductive connecting middle areas 7a, 19a.

Figure 4A:
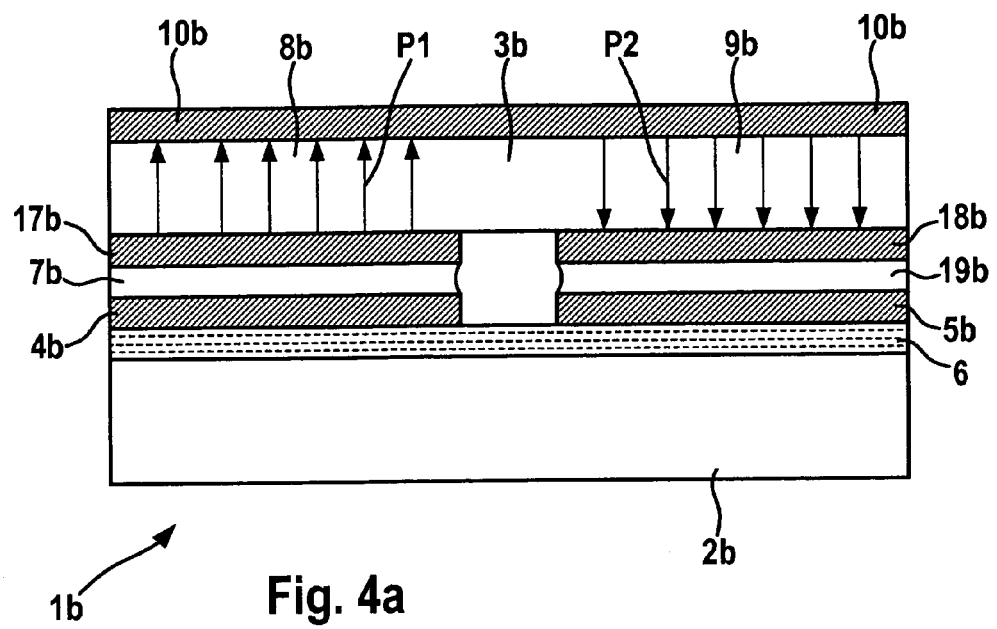
FIG. 4a shows a detail from FIG. 2 according to embodiment having a conductive support device.
Figure 4B:
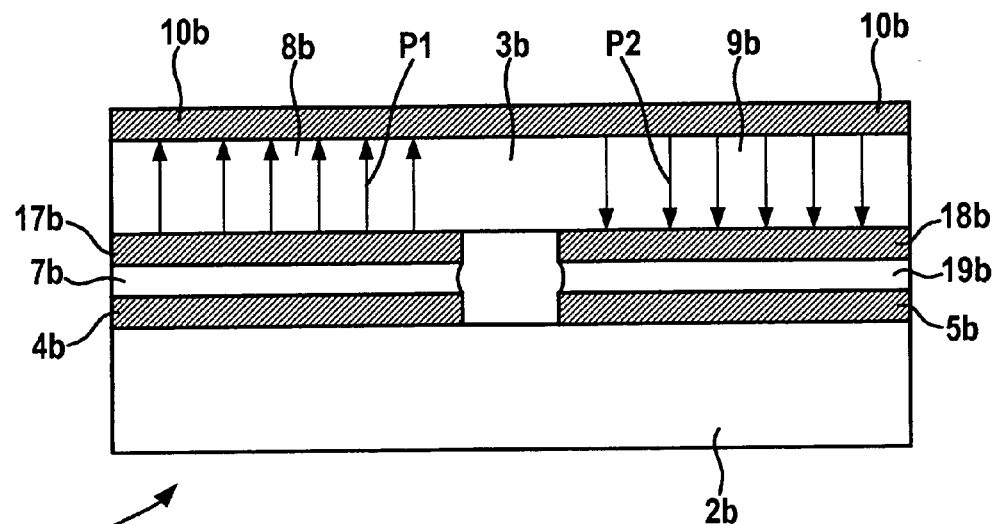
FIG. 4b shows a detail from FIG. 2 according to embodiment having a nonconductive support device.
Figure 5:
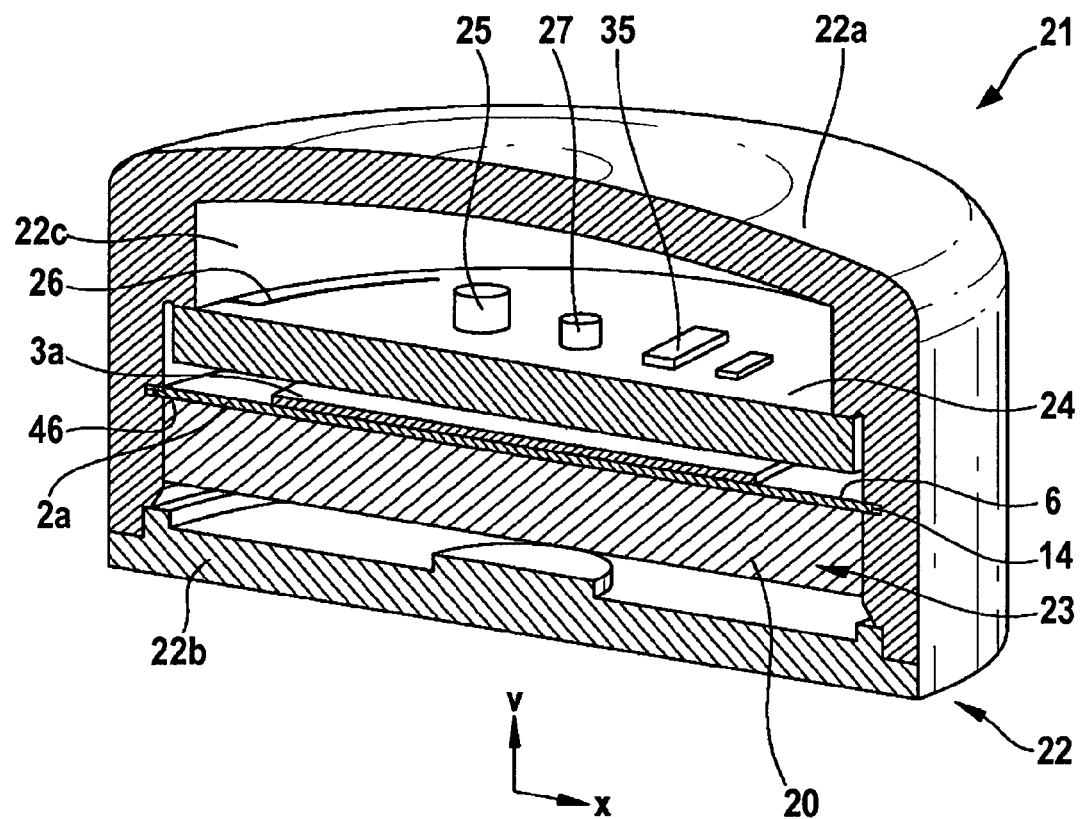
FIG. 5 shows a switching module according to the present invention in a perspective sectional view.

In all the example embodiments of FIGS. 1, 2 and 3, support 2a or 2b may optionally be made of a conductive material or a nonconductive material. FIGS. 4a and 4b show these two designs as examples of the two-segment specific embodiment of FIG. 2, where they are also to be applied to FIGS. 1 and 3, respectively.

In FIG. 4a, support 2b is made of an electrically conductive material, in particular as a metal support, e.g., made of steel plate or brass plate having a high deflection with good elasticity and low material fatigue. An insulating layer 6 is applied between support 2b and connecting electrodes 4b and 5b, preventing electrical contacting between support 2b and connecting electrodes 4b and 5b. As an alternative to this, metal support 2b may also be used directly as one of the connecting electrodes, however, in that insulating layer 6, for example, is recessed beneath electrode 17b and connecting middle area 7b is applied directly to support 2b, which thus forms the first connecting electrode, and layer 4b may thus be omitted.

In the example embodiment of FIG. 4b, support 2a is made of a nonconductive material, e.g., plastic or ceramic, so that insulating layer 6 is omitted here in comparison with FIG. 4a, and terminal contacts connecting electrodes 4b and 5b are formed directly on the top side or the receiving side of support 2b.

The present invention is not limited to the electrode structures described above. Depending on the application, the transducer structure (for example, bimorphic transducers) and the course of the bending line(s), other electrode structures may be more advantageous. For example, more than two electrodes may also be formed here on the piezoelectric element, e.g., in a crosswise configuration for output of a piezoelectric voltage with different or S-shaped bending curves, two or more electrodes then being joined via a diode circuit.

Bending transducers 1a, 1b described here are suitable in particular as a power supply for a circuit module, for example; additional energy sources, for example a battery, may then be dispensable. As an example embodiment of such a circuit module, FIG. 4 shows a cross section through a sensor module 21 which has a housing 22 having a pot-shaped housing upper part 22a and a cover-shaped or disk-shaped housing bottom part 22b surrounding a housing interior 22c. A piezoelectric generator (PEG) 23 and a circuit support 24 having module electronics 25, 27, 35 of SMD components, which are merely indicated here, are accommodated in housing interior 22c. Module electronics 25, 27, 35 may have different components, depending on the use of circuit module 21. A power supply circuit 25 is provided here to receive the piezoelectric voltage and to supply the power supply voltage, advantageously also an energy storage for temporary storage of energy during temporary discontinuous operation. When used as a tire pressure monitoring system (TPMS), a pressure sensor 27, and, as components 35, a control unit, for example, an ASIC, and HF components, for example an oscillator and, if necessary, an HF-ASIC, which are relevant for operation of the antenna, are also mounted on circuit support 24, designed as a circuit board, for example. Antenna 26 indicated in FIG. 2 may run around the outer edge of circuit support 24, for example, as a loop antenna. Fundamentally, however, antenna 26 may also run in or on housing 22, such as on the inside wall of housing 22, or may be integrally molded in housing 22. When used as a tire pressure monitoring system, housing 22 has a hole as a pressure feed from the outside. Sensor module 21 may be accommodated in particular with its axis of symmetry v in the radial direction of the vehicle tire, so that support 2a or 2b and piezoelectric element 3a or 3b extend in lateral direction x.

Piezoelectric generator 23 has a mass element 20, which is movably or adjustably accommodated in housing interior 22c, metal support 2a or 2b as a metallic spring element and piezoelectric element 3a or 3b. Support 2a or 2b is designed essentially as a plate spring and according to FIG. 4a has insulating layer 6 on its top side on which terminal contacts (not shown here) are formed.

Metallic support 2a or 2b is inserted into a housing groove 46 in inside wall 22c of housing top part 22a. Its ends 14 may be clamped or not clamped, so that different frequencies and bending forms may be achieved. In the case when the ends are held by clamping, ends 14 are accommodated fixedly in housing groove 46 on their top and bottom sides. In the case when the ends are not held by clamping, the ends are situated according to FIGS. 1 through 3 with their bottom sides on supporting elements 13a or 13b and may curve upward.

Sensor module 21 may be used in particular as a tire sensor module for measuring a tire pressure, the temperature and/or accelerations, vibrations and oscillations. Thus, vibrations and deformations may be converted into energy via the bending transducer and used for the power supply.

What is claimed is:

1. A bending transducer for generating electrical energy from mechanical deformations, comprising:
   a deformable support device, wherein a first connecting electrode and a second connecting electrode are formed on the deformable support device; and
   a piezoelectric element attached to the support device and having at least one first electrode and one second electrode;
   wherein the following conditions are satisfied:
   the first connecting electrode is contacted with the first electrode of the piezoelectric element, and the second connecting electrode is contacted with the second electrode of the piezoelectric element;
   at least one of the first connecting electrode and the second connecting electrode is applied as areas of at least one structured conductive layer on the support device;
   at least one of the first electrode and the second electrode is integrally and mechanically attached on and contacted with at least one of the first connecting electrode and the second connecting electrode with the aid of one of a conductive adhesive or a conductive solder;
   at least a portion of each one of the first and second connecting electrodes is formed beneath the piezoelectric element and extends laterally outward;
   the first electrode is integrally and mechanically attached on and contacted with the first connecting electrode with the aid of a first conductive connecting middle area;
   the second electrode is integrally and mechanically attached on and contacted with the second connecting electrode with the aid of a second conductive connecting middle area; and
   the piezoelectric element has at least one first segment and one second segment having differently oriented polarizations, the first electrode being formed on the first segment, the second electrode being formed on the second segment, and the first segment and the second segment being electrically connected in series.

2. The bending transducer as recited in claim 1, wherein the first connecting electrode and the second connecting electrode are applied as areas of a shared structured conductive layer on the support device.

3. The bending transducer as recited in claim 1, wherein the support device has a conductive material, and insulation is formed between the support device and at least one of the first and second connecting electrodes.

4. The bending transducer as recited in claim 3, wherein the support device is entirely made of metal, and the insulation is applied on a receiving side of the support device.

5. The bending transducer as recited in claim 3, wherein one of the first and second connecting electrodes is formed on the insulation, and the support device acts as the other one of the first and second connecting electrodes and is contacted with one of the first and second electrodes.

6. The bending transducer as recited in claim 1, wherein the support device, the one of the conductive adhesive or conductive solder, the first and second electrodes, and the piezoelectric element are formed jointly as a layer system of multiple layers stacked on top of each other.

7. The bending transducer as recited in claim 1, wherein the piezoelectric element has a uniform polarization, the first electrode being formed on the connecting side of the piezoelectric element and being contacted with the first connecting electrode by the first conductive connecting middle area, and the second electrode being at least partially formed on a top side of the piezoelectric element opposite the connecting side.

8. The bending transducer as recited in claim 7, wherein the second electrode is entirely formed on the top side of the piezoelectric element and is contacted with the second connecting electrode formed on the support device by a flexurally rigid contact element.

9. The bending transducer as recited in claim 7, wherein the second electrode extends from the top side of the piezoelectric element over an edge electrode area up to a contacting area laterally spaced apart from the first electrode and formed on the connecting side.

10. The bending transducer as recited in claim 9, wherein the first and second electrodes are formed on the connecting side of the piezoelectric element, and a conductive layer, which electrically contacts the first and second segments to connect the first and second segments in series, is applied on the top side of the piezoelectric element opposite the connecting side.

11. A circuit module, comprising:
a housing;
a piezoelectric generator accommodated in the housing, the piezoelectric generator having a mass element configured to be movable inside the housing and a bending transducer, wherein the mass element and the bending transducer form a vibration-capable system, and wherein the piezoelectric element is elastically deformable with the vibration of the vibration-capable system; and a power supply circuit for receiving a piezoelectric voltage output by the piezoelectric element during a mechanical deformation of the piezoelectric element and for supplying power to the circuit module;
wherein the bending transducer includes:
a deformable support device, wherein a first connecting electrode and a second connecting electrode are formed on the deformable support device; and
a piezoelectric element attached to the support device and having at least one first electrode and one second electrode;
and wherein the following conditions are satisfied:
the first connecting electrode is contacted with the first electrode of the piezoelectric element, and the second connecting electrode is contacted with the second electrode of the piezoelectric element;
at least one of the first connecting electrode and the second connecting electrode is applied as areas of at least one structured conductive layer on the support device;
at least one of the first electrode and the second electrode is integrally and mechanically attached on and contacted with at least one of the first connecting electrode and the second connecting electrode with the aid of one of a conductive adhesive or a conductive solder;
at least a portion of each one of the first and second connecting electrodes is formed beneath the piezoelectric element and extends laterally outward;
the first electrode is integrally and mechanically attached on and contacted with the first connecting electrode with the aid of a first conductive connecting middle area;
the second electrode is integrally and mechanically attached on and contacted with the second connecting electrode with the aid of a second conductive connecting middle area; and
the piezoelectric element has at least one first segment and one second segment having differently oriented polarizations, the first electrode being formed on the first segment, the second electrode being formed on the second segment, and the first segment and the second segment being electrically connected in series.

12. The circuit module as recited in claim 11, wherein the circuit module is an energetically autarkic sensor module configured to measure at least one of an internal tire pressure, a temperature, and acceleration.

* * * * *

UNITED STATES PATENT AND TRADEMARK OFFICE
CERTIFICATE OF CORRECTION

PATENT NO. : 8,418,544 B2  Page 1 of 1
APPLICATION NO. : 12/735485
DATED : April 16, 2013
INVENTOR(S) : Hortig et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 442 days.

Signed and Sealed this

First Day of September, 2015

Michelle K. Lee
*Director of the United States Patent and Trademark Office*